United States Patent
Maxim et al.

(10) Patent No.: US 10,361,667 B2
(45) Date of Patent: Jul. 23, 2019

(54) LOW NOISE AMPLIFIER CIRCUIT

(71) Applicant: Qorvo US, Inc., Greensboro, NC (US)

(72) Inventors: George Maxim, Saratoga, CA (US); Marcus Granger-Jones, Scotts Valley, CA (US); Toshiaki Moriuchi, San Jose, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/836,334

(22) Filed: Dec. 8, 2017

(65) Prior Publication Data

US 2019/0181813 A1    Jun. 13, 2019

(51) Int. Cl.
| | |
|---|---|
| *H03F 3/68* | (2006.01) |
| *H03F 3/193* | (2006.01) |
| *H03F 3/21* | (2006.01) |
| *H03F 1/26* | (2006.01) |

(52) U.S. Cl.
CPC ............... *H03F 3/193* (2013.01); *H03F 1/26* (2013.01); *H03F 3/21* (2013.01); *H03F 2200/111* (2013.01); *H03F 2200/294* (2013.01); *H03F 2200/372* (2013.01)

(58) Field of Classification Search
CPC .................................... H03F 1/26; H03F 3/68
USPC ...................... 330/124 R, 149, 295
See application file for complete search history.

(56) References Cited

U.S. PATENT DOCUMENTS

| | | |
|---|---|---|
| 6,434,122 B2 | 8/2002 | Barabash et al. |
| 8,008,970 B1 | 8/2011 | Homol et al. |
| 8,571,498 B2 | 10/2013 | Khlat |
| 8,909,175 B1 | 12/2014 | McCallister |
| 9,112,452 B1 | 8/2015 | Khlat |
| 9,484,865 B2 | 11/2016 | Kobayashi et al. |
| 2006/0244513 A1 | 11/2006 | Yen et al. |

(Continued)

OTHER PUBLICATIONS

Ex Parte Quayle Action for U.S. Appl. No. 15/678,245, mailed Jun. 6, 2018, 4 pages.

(Continued)

*Primary Examiner* — Steven J Mottola
(74) *Attorney, Agent, or Firm* — Withrow & Terranova, P.L.L.C.

(57) ABSTRACT

Embodiments of the disclosure relate to a low noise amplifier (LNA) circuit. The LNA circuit includes an LNA configured to amplify a radio frequency (RF) input signal to generate an RF output signal. The LNA may be inherently nonlinear and, as a result, can create a harmonic distortion(s), such as second harmonic distortion (HD2), and/or an intermodulation distortion(s), such as second order intermodulation distortion (IMD2), in the RF output signal. In exemplary aspects discussed herein, a distortion amplifier(s) is provided in the LNA circuit to generate a distortion signal(s) to suppress the harmonic distortion(s) and/or the intermodulation distortion(s) in the RF output signal. By suppressing the harmonic distortion(s) and/or the intermodulation distortion(s) in the RF output signal, the LNA circuit may protect an adjacent RF band(s), such as the fifth-generation ultra-high-band (5G UHB), from the harmonic and/or intermodulation distortion(s) without compromising overall noise figure (NF) of the LNA circuit.

17 Claims, 13 Drawing Sheets

(56) References Cited

U.S. PATENT DOCUMENTS

| | | |
|---|---|---|
| 2009/0045877 A1 | 2/2009 | Wang et al. |
| 2010/0219887 A1 | 9/2010 | Ichitsubo et al. |
| 2010/0283534 A1 | 11/2010 | Pierdomenico |
| 2012/0062205 A1 | 3/2012 | Levesque et al. |
| 2012/0176196 A1 | 7/2012 | Khlat |
| 2012/0281597 A1 | 11/2012 | Khlat et al. |
| 2013/0141064 A1 | 6/2013 | Kay et al. |
| 2013/0141068 A1 | 6/2013 | Kay et al. |
| 2013/0165132 A1 | 6/2013 | Goedken et al. |
| 2013/0285750 A1 | 10/2013 | Chowdhury et al. |
| 2013/0307617 A1 | 11/2013 | Khlat et al. |
| 2014/0062590 A1 | 3/2014 | Khlat et al. |
| 2014/0105327 A1 | 4/2014 | Geng et al. |
| 2015/0091653 A1 | 4/2015 | Kobayashi et al. |
| 2015/0180422 A1 | 6/2015 | Khlat et al. |
| 2015/0234402 A1 | 8/2015 | Kay et al. |
| 2015/0349724 A1* | 12/2015 | Wang ................ H03F 1/32 330/285 |
| 2016/0164476 A1 | 6/2016 | Wang et al. |
| 2017/0124013 A1 | 5/2017 | Vaillancourt et al. |

OTHER PUBLICATIONS

Notice of Allowance for U.S. Appl. No. 151825,562, dated Jun. 11, 2018, 8 pages.
Notice of Allowance for U.S. Appl. No. 15/830,686, dated May 24, 2018, 8 pages.
Notice of Allowance for U.S. Appl. No. 15/837,496, dated May 25, 2018, 8 pages.

* cited by examiner

LOW NOISE AMPLIFIER CIRCUIT

FIELD OF THE DISCLOSURE

The technology of the disclosure relates generally to low noise amplifiers (LNAs).

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Filters and low noise amplifiers (LNAs) are the basic building blocks of the mobile communication devices. The filters, which can include band pass filters, band stop filters, high pass filters, and low pass filters, are typically coupled to radio frequency (RF) transceivers to enable frequency selection and noise suppression. The purpose of the LNAs, on the other hand, is to amplify a received radio frequency (RF) signal to an acceptable level with minimum self-generated additional noise. Gain, noise figure (NF), impedance matching, linearity, and stability are the de facto standards for determining LNA performance. As such, it may be desired to design LNAs with improved gain, NF, linearity, and stability to further enhance the user experiences of the mobile communication devices.

SUMMARY

Embodiments of the disclosure relate to a low noise amplifier (LNA) circuit. The LNA circuit includes an LNA configured to amplify a radio frequency (RF) input signal to generate an RF output signal. The LNA may be inherently nonlinear and, as a result, can create a harmonic distortion(s), such as a second harmonic distortion (HD2), and/or an intermodulation distortion(s), such as a second order intermodulation distortion (IMD2), in the RF output signal. In exemplary aspects discussed herein, a distortion amplifier(s) is provided in the LNA circuit to generate a distortion signal(s) to suppress the harmonic distortion(s) and/or the intermodulation distortion(s) in the RF output signal. By suppressing the harmonic distortion(s) and/or the intermodulation distortion(s) in the RF output signal, the LNA circuit may protect an adjacent RF band(s), such as the fifth-generation ultra-high-band (5G UHB), from the harmonic and/or intermodulation distortion(s) without compromising overall noise figure (NF) of the LNA circuit.

In one aspect, an LNA circuit is provided. The LNA circuit includes a signal input configured to receive an RF input signal in at least one defined RF band. The LNA circuit also includes a signal output configured to output an RF output signal in the at least one defined RF band. The LNA circuit also includes an LNA provided between the signal input and the signal output and configured to amplify the RF input signal to generate the RF output signal. The RF output signal generated by the LNA comprises at least one distortion term outside the at least one defined RF band. The LNA circuit also includes at least one distortion amplifier provided in parallel to the LNA and configured to generate at least one distortion signal comprising the at least one distortion term. The LNA circuit also includes combiner circuitry configured to combine the RF output signal and the at least one distortion signal to suppress the at least one distortion term in the RF output signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
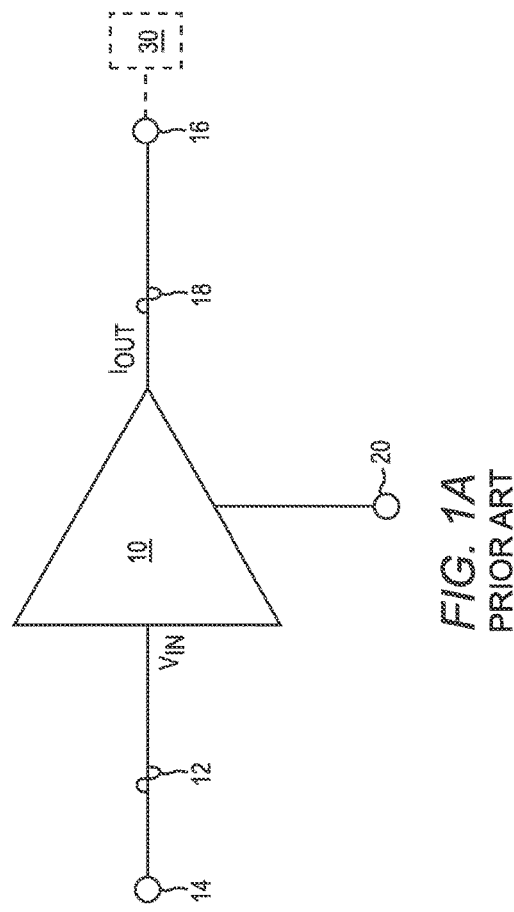
FIG. 1A is a schematic diagram of an exemplary conventional single-ended low noise amplifier (LNA) that is unable to suppress harmonics and/or intermodulation distortions when the LNA amplifies a radio frequency (RF) signal.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a low noise amplifier (LNA) circuit. The LNA circuit includes an LNA configured to amplify a radio frequency (RF) input signal to generate an RF output signal. The LNA may be inherently nonlinear and, as a result, can create a harmonic distortion(s), such as a second harmonic distortion (HD2), and/or an intermodulation distortion(s), such as a second order intermodulation distortion (IMD2), in the RF output signal. In exemplary aspects discussed herein, a distortion amplifier(s) is provided in the LNA circuit to generate a distortion signal(s) to suppress the harmonic distortion(s) and/or the intermodulation distortion(s) in the RF output signal. By suppressing the harmonic distortion(s) and/or the intermodulation distortion(s) in the RF output signal, the LNA circuit may protect an adjacent RF band(s), such as the fifth-generation ultra-high-band (5G UHB), from the harmonic and/or intermodulation distortion(s) without compromising overall noise figure (NF) of the LNA circuit.

Before discussing the LNA circuit of the present disclosure, a brief overview of a traditional single-ended LNA that is unable to suppress a harmonic(s) and/or an intermodulation distortion(s) while amplifying an RF signal is first provided with reference to FIGS. 1A-1D. The discussion of specific exemplary aspects of an LNA circuit configured to suppress a harmonic(s) and/or an intermodulation distortion(s) while amplifying an RF signal starts below with reference to FIG. 2.

FIG. 1A is a schematic diagram of an exemplary conventional single-ended LNA 10 that is unable to suppress harmonics and/or intermodulation distortions when the conventional single-ended LNA 10 amplifies an RF signal 12. The conventional single-ended LNA 10 includes a signal input 14 and a signal output 16. The conventional single-ended LNA 10 receives the RF signal 12 at the signal input 14, amplifies the received RF signal 12, and outputs an amplified RF signal 18 at the signal output 16.

The conventional single-ended LNA 10, which can also be referenced interchangeably as a transconductance amplifier, is an amplifier configured to generate an output current $I_{OUT}$ at the signal output 16 when an input voltage $V_{IN}$ is applied between the signal input 14 and a common node 20. In this regard, the output current $I_{OUT}$ changes in response to changes of the input voltage $V_{IN}$. The transconductance $g_m$ of the conventional single-ended LNA 10 can be described by the equation (Eq. 1) below.

$$g_m = \frac{I_{OUT}}{V_{IN}} \tag{Eq. 1}$$

The conventional single-ended LNA 10 is inherently nonlinear. As a result, the conventional single-ended LNA 10 can generate harmonic distortions, such as HD2 and third harmonic distortion (HD3), and/or intermodulation distortions, such as IMD2 and third order intermodulation distortion (IMD3), in the amplified RF signal 18. The harmonics and/or the intermodulation distortions, particularly the HD2 and/or the IMD2, may fall into an adjacent RF spectrum. As a result, the 5G UHB may suffer degraded RF performances.

Figure 1B:
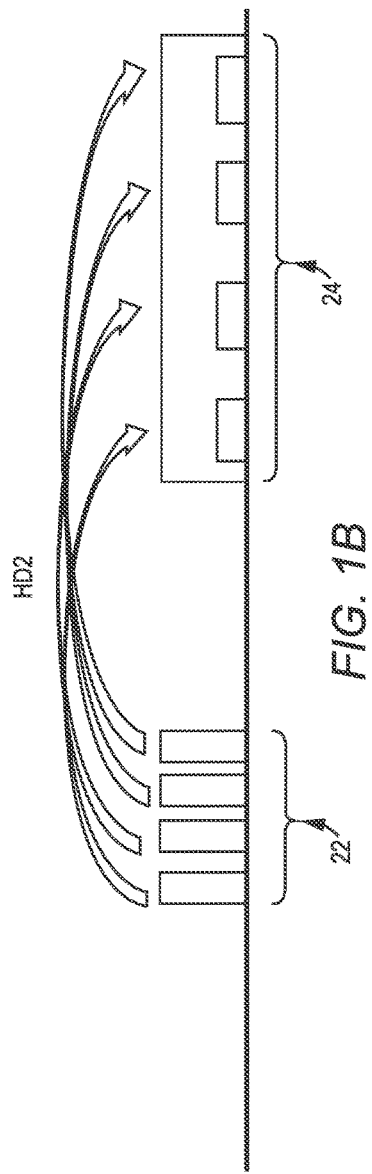
FIG. 1B is a schematic diagram providing an exemplary illustration of a second harmonic distortion (HD2) associated with the RF signal of FIG. 1A in a fourth-generation (4G) mid-band (MB) that can fall into a fifth-generation (5G) ultra-high-band (UHB)

FIG. 1B is a schematic diagram providing an exemplary illustration of an HD2 associated with the RF signal 12 of FIG. 1A in a fourth-generation (4G) mid-band (MB) 22 that can fall into a fifth-generation (5G) ultra-high-band (UHB) 24. In a non-limiting example, the 4G MB 22 is between 1.6-2.1 GHz and the 5G UHB is between 3.3-4.2 GHz. Accordingly, when the RF signal 12 is amplified by the conventional single-ended LNA 10 of FIG. 1A, the conventional single-ended LNA 10 generates the HD2 at a frequency $f_{HD2}$ between 3.2-4.2 GHz, which completely overlaps the 5G UHB and thus causes interference to the 5G UHB.

Figure 1C:
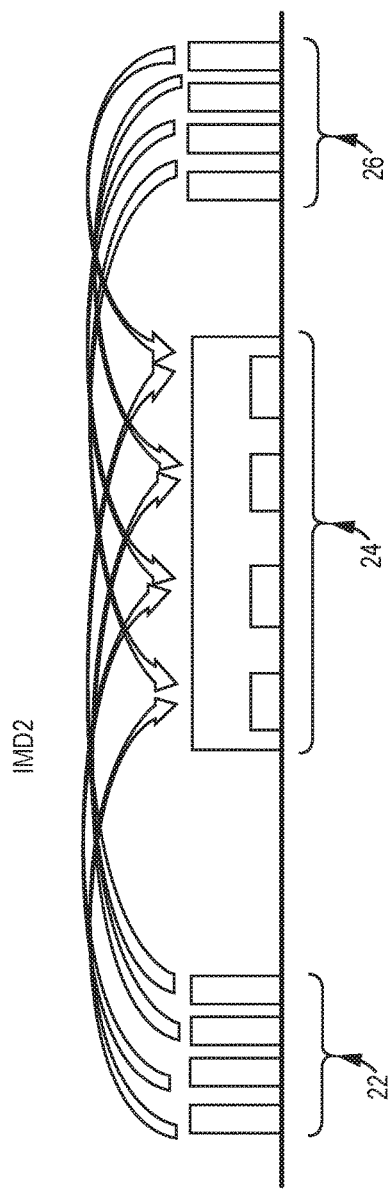
FIG. 1C is a schematic diagram providing an exemplary illustration of a second order intermodulation distortion (IMD2) associated with the RF signal of FIG. 1A in the 4G MB and a Wi-Fi band that can fall into the 5G UHB of FIG. 1B.
Figure 1D:
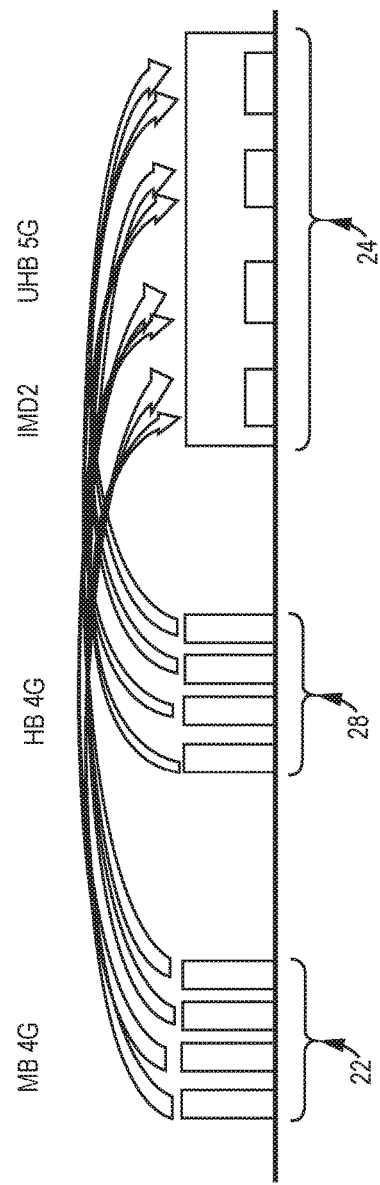
FIG. 1D is a schematic diagram providing an exemplary illustration of an IMD2 associated with the RF signal of FIG. 1A in the 4G MB of FIG. 1B and a 4G high-band (HB) that can fall into the 5G UHB of FIG. 1B.

In some application scenarios, the RF signal 12 may occupy a first RF band and a second RF band. As a result, the conventional single-ended LNA 10 may generate an intermodulation distortion(s) that can impact the 5G UHB 24. FIGS. 1C and 1D illustrate two possible scenarios of the intermodulation distortion(s) that impact the 5G UHB 24.

FIG. 1C is a schematic diagram providing an exemplary illustration of an IMD2 associated with the RF signal 12 of FIG. 1A in the 4G MB 22 of FIG. 1B and a Wi-Fi band 26 that can fall into the 5G UHB 24 of FIG. 1B. In a non-limiting example, the Wi-Fi band has a lower frequency $f_2$ at 5.17 GHz. The 4G MB 22, on the other hand, has an upper frequency $f_1$ at 2.1 GHz. Accordingly, the 4G MB 22 and the Wi-Fi band 26 can create the IMD2 at a frequency $f_{IMD2}$ at 3.07 GHz ($f_{IMD2}=f_2-f_1$), which falls into the 5G UHB 24.

FIG. 1D is a schematic diagram providing an exemplary illustration of an IMD2 associated with the RF signal 12 of FIG. 1A in the 4G MB 22 of FIG. 1B and a 4G high-band (HB) 28 can fall into the 5G UHB 24 of FIG. 1B. In a non-limiting example, the 4G HB 28 that has a lower frequency $f_2$ at 2.2 GHz. The 4G MB 22, on the other hand, has a lower frequency $f_1$ at 1.6 GHz. Accordingly, the 4G MB 22 and the 4G HB 28 can create the IMD2 at a frequency $f_{IMD2}$ at 3.8 GHz ($f_{IMD2}=f_2+f_1$), which falls into the 5G UHB 24.

As illustrated in FIGS. 1B-1D, the conventional single-ended LNA 10 can generate harmonic distortions (e.g., the HD2) and/or intermodulation distortions (e.g., the IMD2) when amplifying the RF signal 12, thus negatively impacting the 5G UHB 24. As such, it may be desirable if the conventional single-ended LNA 10 can eliminate, or at least suppress, the harmonic distortions and/or the intermodulation distortions to help protect the 5G UHB 24 from interferences.

With reference back to FIG. 1A, it may be possible to couple the signal output 16 of the conventional single-ended LNA 10 to an RF filter 30, such as a surface acoustic wave (SAW) filter and a bulk acoustic wave (BAW) filter, to suppress or even eliminate the harmonic distortions and/or the intermodulation distortions associated with the amplified RF signal 18 in selected RF bands. However, the RF filter 30 can be less effective in protecting the 5G UHB 24 due largely to dense deployment and heavy usage throughout the 5G UHB 24.

Although it may be possible to replace the conventional single-ended LNA 10 with a differential LNA to help suppress the harmonic distortions and/or the intermodulation distortions, doing so would require a front-end transformer to be added in front of the differential LNA to convert the RF signal 12 into a differential RF signal. Notably, adding the front-end transformer can reduce noise figure (NF) of the differential LNA, thus compromising overall RF performance of the differential LNA.

In an exemplary 5G receive scenario, it may be desirable to suppress the HD2 to between −106 dBm and −110 dBm in an HD2 frequency. If an antenna receiving a 5G RF signal in the 5G UHB 24 can provide 15 dB of isolation and a typical 35 dB of HD2 rejection, it may only be possible to reduce the HD2 to approximately −27 dBm at the signal input 14. As a result, the HD2 fall into the 5G UHB 24 would be approximately −50 dBm. Even if a triplexer, which can provide an additional 12-15 dB of rejection, is employed to separate receiving paths between the 4G MB 22 and the 5G UHB 24, there is still a need for approximately 10-13 dB of HD2 rejection. Hence, it may be desirable to enhance the conventional single-ended LNA 10 to help protect the 5G UHB 24 from interferences caused by the harmonic distortions and/or the intermodulation distortions.

Figure 2:
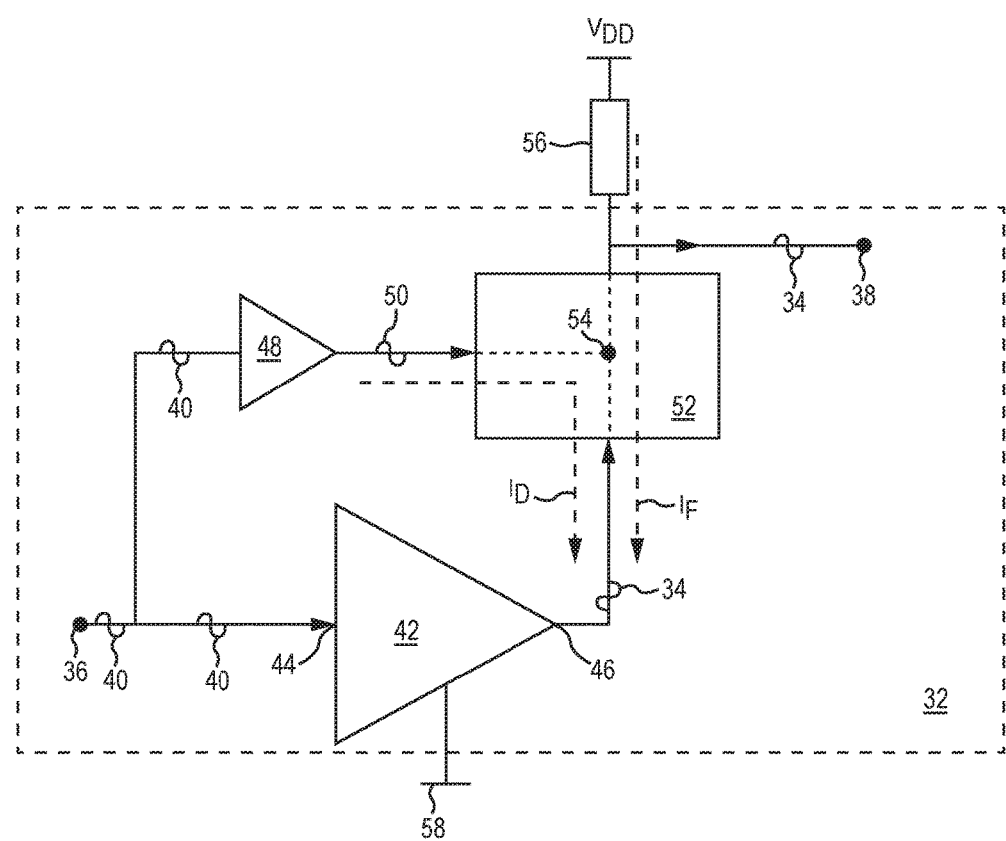
FIG. 2 is a schematic diagram of an exemplary LNA circuit configured to suppress at least one distortion term (e.g., HD2 and/or IMD2) associated with an RF output signal.

In this regard, FIG. 2 is a schematic diagram of an exemplary LNA circuit 32 configured to suppress at least one distortion term associated with an RF output signal 34. In examples discussed herein, the phrase "distortion term" refers generally to any harmonic distortion (e.g., HD2, HD3, and so on) and/or any intermodulation distortion (e.g., IMD2, IMD3, and so on) that may be associated with the RF output signal 34.

The LNA circuit 32 includes a signal input 36 and a signal output 38. The signal input 36 is configured to receive an RF input signal 40 in at least one defined RF band (e.g., the 4G MB, the 4G HB, and/or the Wi-Fi band). The LNA circuit 32 includes an LNA 42, which may be functionally equivalent to the conventional single-ended LNA 10 of FIG. 1A. The LNA 42 includes an input node 44 and an output node 46. The input node 44 is coupled to the signal input 36 and the output node 46 is coupled to the signal output 38 to output the RF output signal 34. The LNA 42 is configured to receive the RF input signal 40 in the defined RF band at the input node 44, amplify the RF input signal 40 to generate the RF output signal 34 in the defined RF band at the output node 46. For the convenience of reference and distinction, an RF spectrum occupied by the RF output signal 34 within the defined RF band is hereinafter referred to as a "fundamental term." Notably, the LNA 42 can be inherently nonlinear. As such, the RF output signal 34 at the output node 46 also includes at least one distortion term (e.g., HD2, HD3, IMD2, IMD3, etc.) located outside the defined RF band of the RF output signal 34. As illustrated previously in FIGS. 1B-1D, the distortion term may interfere with the 5G UHB.

As is further discussed in various embodiments below, the LNA circuit 32 includes at least one distortion amplifier 48 provided in parallel to the LNA 42. The distortion amplifier 48 is configured to receive and amplify the RF input signal 40 to generate at least one distortion signal 50. Like the LNA 42, the distortion amplifier 48 is also inherently nonlinear. As a result, the distortion signal 50 generated by the distortion amplifier 48 includes both the fundamental term and the distortion term. In this regard, the distortion amplifier 48 is further configured to block the fundamental term (e.g., the RF input signal 40 in the defined RF band) and output exclusively the distortion term (e.g., HD2, HD3, IMD2, IMD3, etc.) in the distortion signal 50. Notably, it may be difficult for the distortion amplifier 48 to completely block the fundamental term of the RF input signal 40. As such, the distortion signal 50 may include a residual of the fundamental term. Nevertheless, the distortion signal 50 is dominated primarily by the distortion term.

The distortion amplifier 48 is configured to output the distortion term in the distortion signal 50 with substantially similar amplitude as the distortion term in the RF output signal 34 generated by the LNA 42. In a non-limiting example, amplitudes of the distortion term in the distortion signal 50 and the distortion term in the RF output signal 34 differ by less than plus/minus one percent (<±1%).

The distortion amplifier 48 is further configured to output the distortion term in the distortion signal 50 with substantially opposite phase to the distortion term in the RF output signal 34. In a non-limiting example, phases of the distortion term in the distortion signal 50 and the distortion term in the RF output signal 34 differ by one hundred eighty degree (180°) plus/minus one degree (180°±1°).

The LNA circuit 32 further includes combiner circuitry 52 configured to couple the LNA 42 and the distortion amplifier 48 to the signal output 38. In a non-limiting example, the combiner circuitry 52 can be implemented as simple as a common coupling point 54 between the LNA 42, the distortion amplifier 48, and the signal output 38. Notably, the combiner circuitry 52 may also include other active and/or passive elements as needed.

The combiner circuitry 52 receives the RF output signal 34, which includes the fundamental term and the distortion term, from the LNA 42. The combiner circuitry 52 also receives the distortion signal 50, which includes the distortion term, from the distortion amplifier 48. The combiner circuitry 52 combines the RF output signal 34 received from the LNA 42 with the distortion signal 50. Since the distortion term in the distortion signal 50 has a substantially similar amplitude and a substantially opposite phase to the distortion term in the RF output signal 34, the distortion term in the distortion signal 50 can substantially cancel the distortion term in the RF output signal 34. In a non-limiting example, the distortion term in the distortion signal 50 can cancel at least ninety nine percent (99%) of the distortion term in the RF output signal 34. As such, the RF output signal 34 presented to the signal output 38 by the combiner circuitry 52 would include primarily the fundamental term. As a result, the LNA circuit 32 is able to provide adequate protection in the 5G UHB against interferences caused by the distortion term (e.g., HD2, HD3, IMD2, IMD3, etc.).

The LNA circuit 32 can be coupled to a voltage source $V_{DD}$ via load circuitry 56. The LNA circuit 32 can be further coupled to a ground 58. The voltage source $V_{DD}$ may provide a supply voltage to the LNA 42 and the distortion amplifier 48. The supply voltage provided by the voltage source $V_{DD}$ causes a distortion current $I_D$ to flow from the distortion amplifier 48 toward the ground 58, thus diverting the distortion term in the RF output signal 34 to the ground 58.

The load circuitry 56 represents low impedance to the common coupling point 54, while the LNA 42 and the distortion amplifier 48 represent high impedance to the common coupling point 54. As a result, a fundamental current $I_F$, which flows through the load circuitry 56 and the common coupling point 54 toward the ground 58, would include primarily the fundamental term. Hence, adding the distortion amplifier 48 would have a negligible impact on an overall noise figure (NF) of the LNA circuit 32.

Figure 3A:
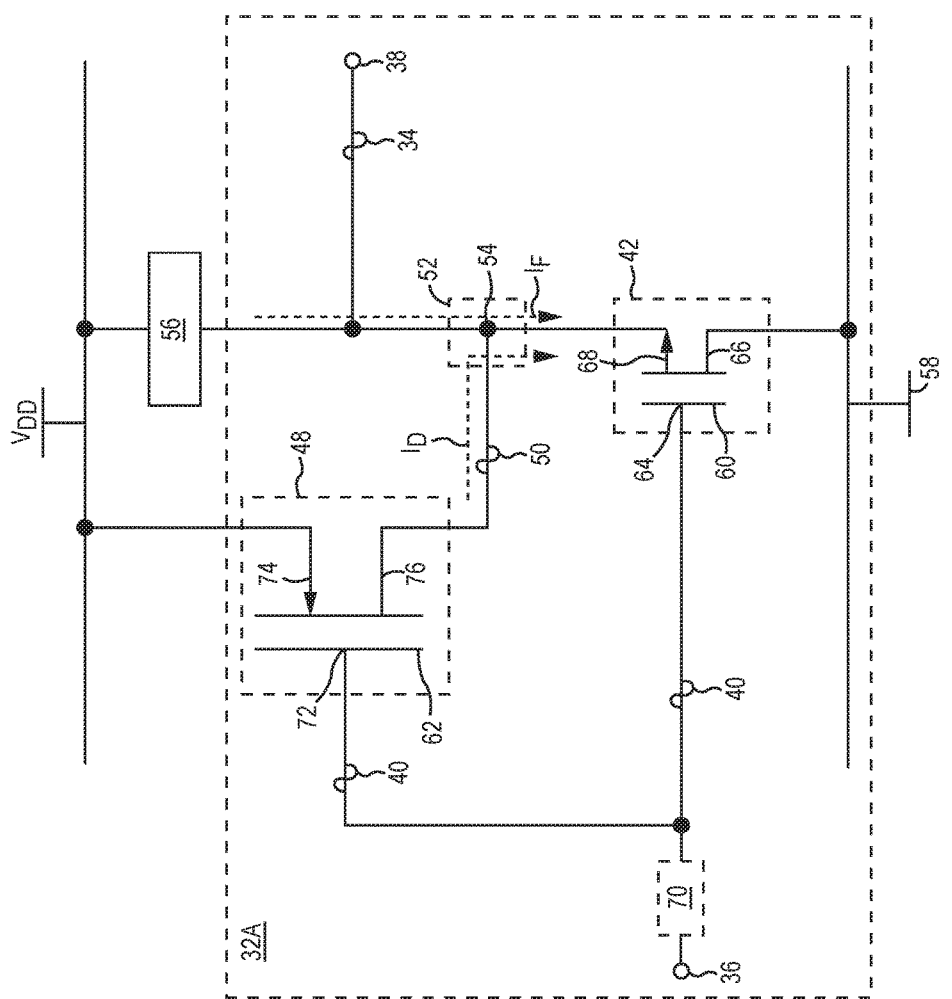
FIG. 3A is a schematic diagram of an LNA circuit provided according to one embodiment of the present disclosure.

In one exemplary embodiment, the LNA 42 and the distortion amplifier 48 can be enabled by an n-type metal-oxide semiconductor field-effect transistor (nMOSFET) and a p-type metal-oxide semiconductor field-effect transistor (pMOSFET), respectively. In this regard, FIG. 3A is a schematic diagram of an LNA circuit 32A of FIG. 2 provided according to one embodiment of the present disclosure. Common elements between FIGS. 2 and 3A are shown therein with common element numbers and will not be re-described herein.

The LNA 42 includes an nMOSFET 60 and the distortion amplifier 48 includes a pMOSFET 62. The nMOSFET 60 has a first gate electrode 64, a first source electrode 66, and a first drain electrode 68. The first gate electrode 64 is coupled to the signal input 36 via input match circuitry 70, the first source electrode 66 is coupled to the ground 58, and the first drain electrode 68 is coupled to the combiner circuitry 52. The pMOSFET 62 includes a second gate electrode 72, a second source electrode 74, and a second drain electrode 76. The second gate electrode 72 is coupled to the first gate electrode 64, the second source electrode 74 is coupled to the voltage source $V_{DD}$, and the second drain electrode 76 is coupled to the combiner circuitry 52.

The nMOSFET 60 has a first channel region between the first source electrode 66 and the first drain 68, and the pMOSFET 62 has a second channel region between the second source electrode 74 and the second drain electrode 76. The first channel region has a first channel length and the second channel region has a second channel length. In a non-limiting example, the pMOSFET 62 is a long-channel MOSFET having the second channel length that is at least two times longer than the first channel length of the nMOSFET 60. As such, the pMOSFET 62 can be configured to block the fundamental term of the RF input signal 40, while outputting the distortion term in the distortion signal 50.

Figure 3B:
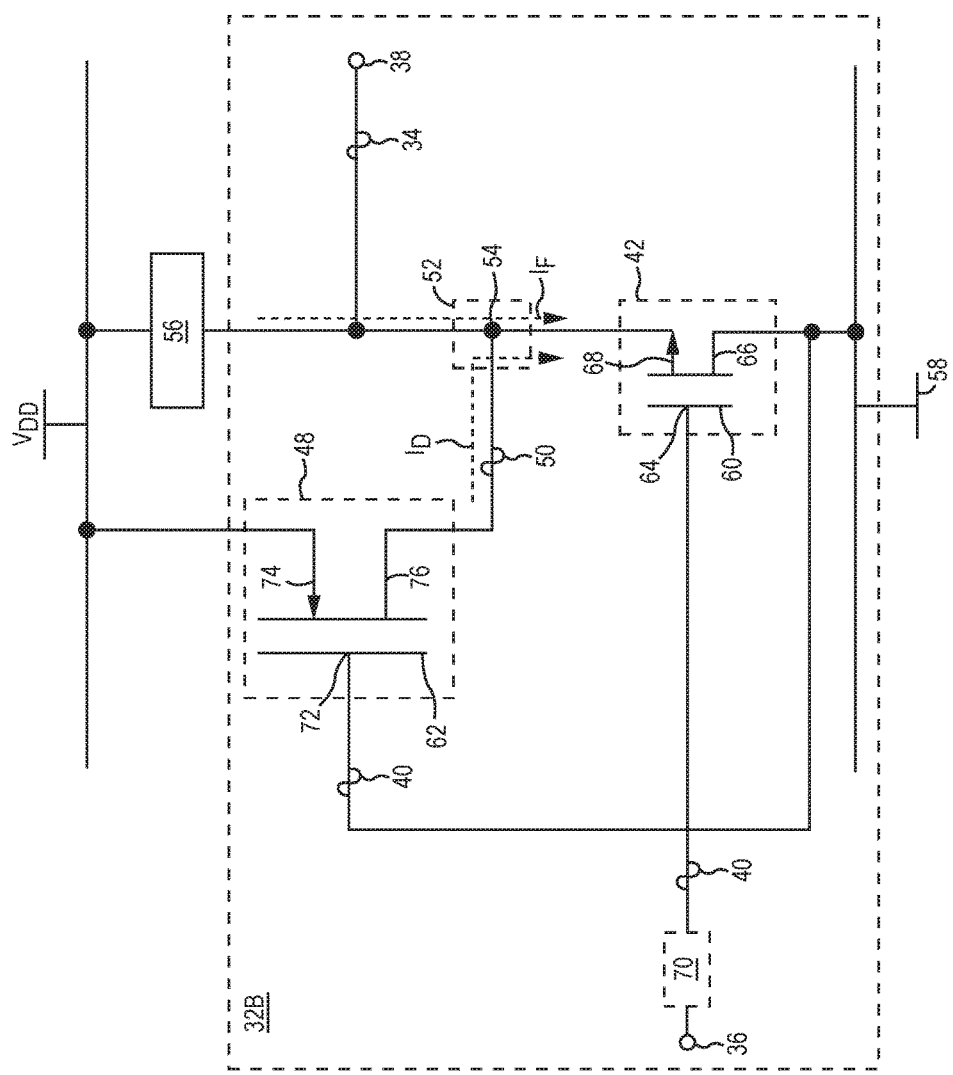
FIG. 3B is a schematic diagram of an LNA circuit provided according to another embodiment of the present disclosure.

Alternatively to coupling the second gate electrode 72 to the first gate electrode 64, it may also be possible to couple the second gate electrode 72 to the first source electrode 66, as illustrated in FIG. 3B. In this regard, FIG. 3B is a schematic diagram of an LNA circuit 32B provided according to another embodiment of the present disclosure. Common elements between FIGS. 2, 3A, and 3B are shown therein with common element numbers and will not be re-described herein.

As shown in the LNA circuit 32B, the second gate electrode 72 is coupled to the first source electrode 66. Given that there is very little signal attenuation (e.g., <−30 dB) between the first gate electrode 64 and the first source electrode 66, the RF input signal 40 received by the second gate electrode 72 is almost identical to the RF input signal 40 at the first gate electrode 64.

Figure 3C:
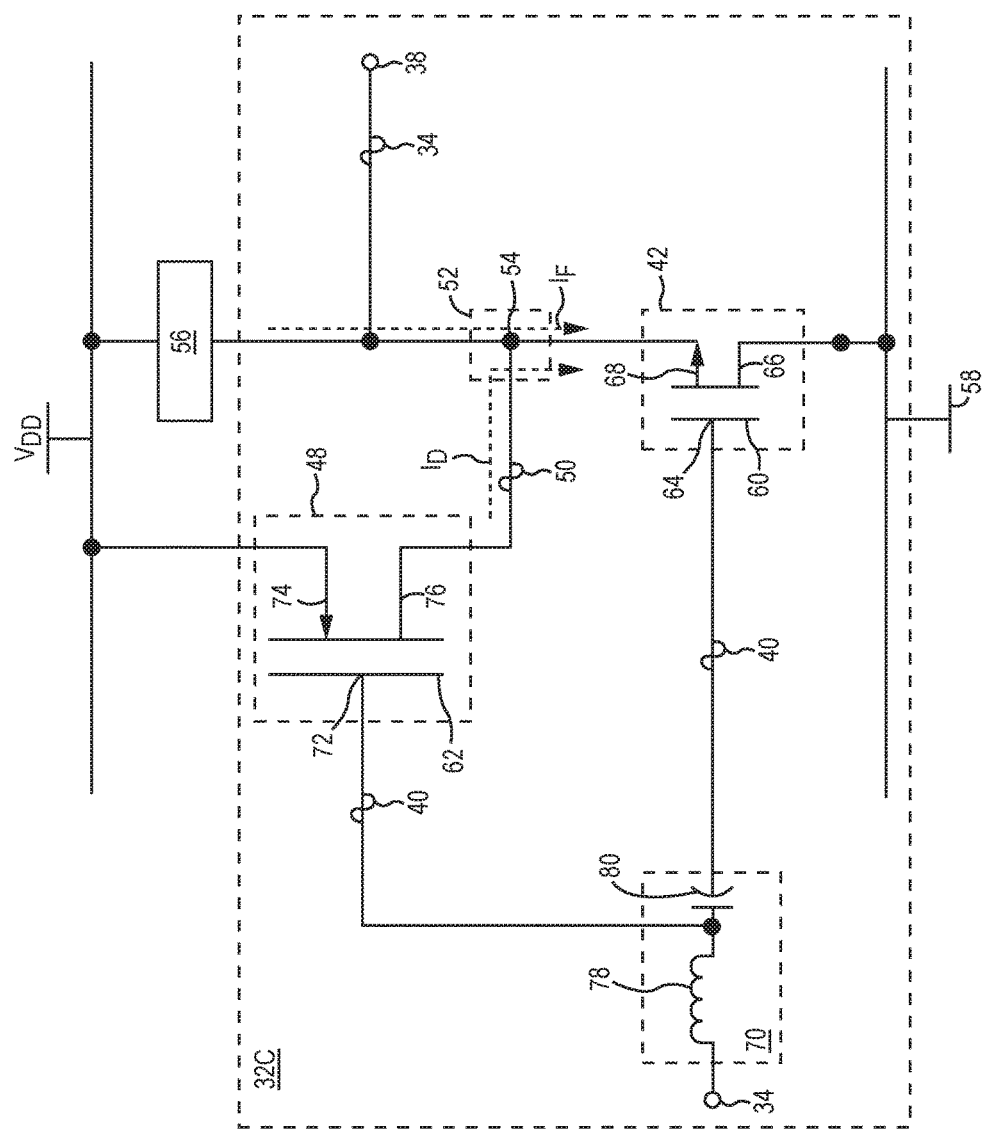
FIG. 3C is a schematic diagram of an LNA circuit provided according to another embodiment of the present disclosure.

FIG. 3C is a schematic diagram of an LNA circuit 32C provided according to another embodiment of the present disclosure. Common elements between FIGS. 2, 3A, and 3C are shown therein with common element numbers and will not be re-described herein.

The input match circuitry 70 may include an input match inductor 78 and an input match capacitor 80. In this regard, the second gate electrode 72 may be coupled between the input match inductor 78 and the input match capacitor 80.

As previously described in FIG. 2, the distortion amplifier 48 can help suppress the HD2 in the RF output signal 34 without significantly impacting the overall NF of the LNA circuit 32. In this regard, simulation results illustrating such impacts of the distortion amplifier 48 are discussed next with references to FIGS. 4A-4C.

Figure 4A:
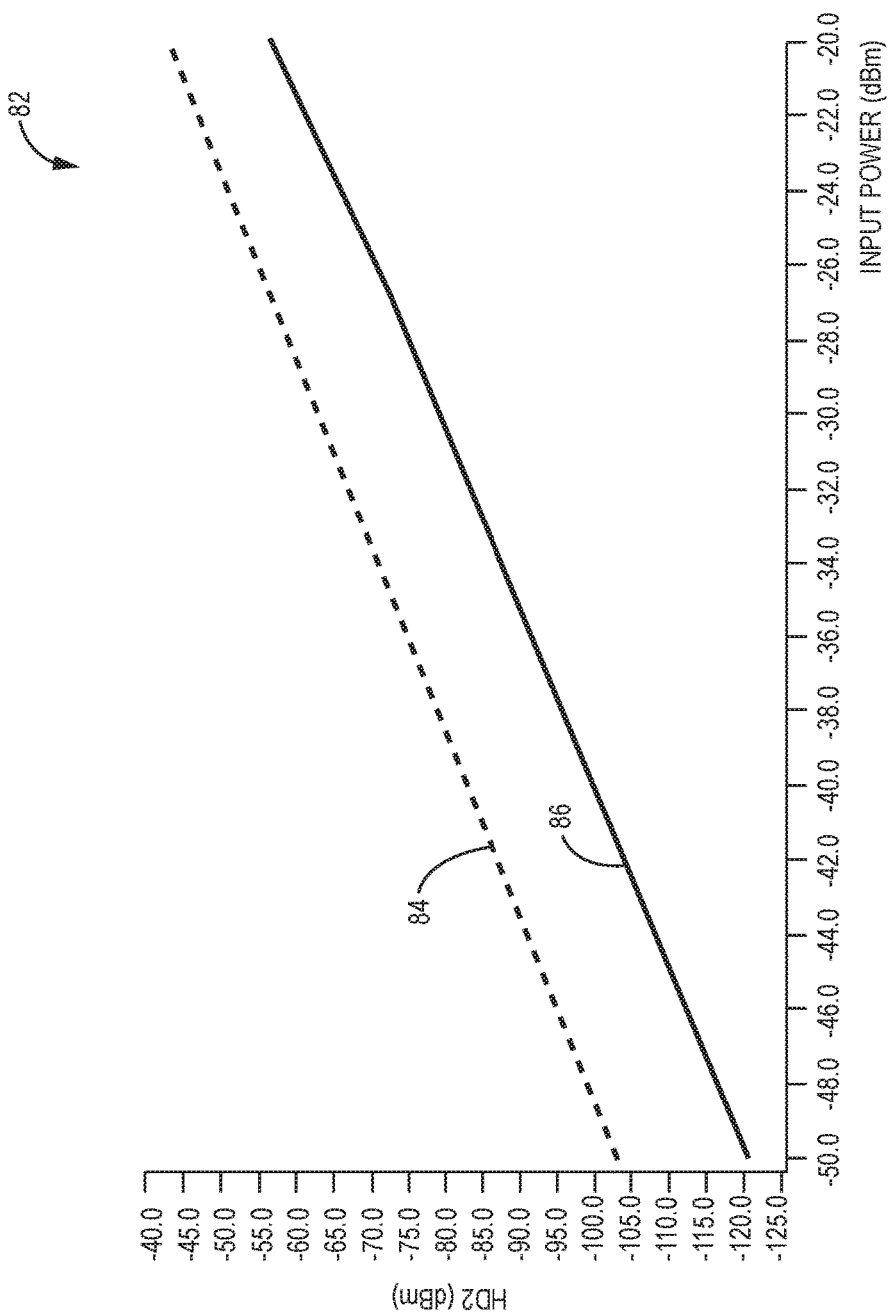
FIG. 4A is an HD2-vs-input-power graph providing an exemplary illustration of HD2 reduction that may be achieved by the LNA circuit 32 of FIG. 2.

FIG. 4A is a HD2-vs-input-power graph 82 providing an exemplary illustration of HD2 reduction that may be achieved by the LNA circuit 32 of FIG. 2. The HD2-vs-input-power graph 82 includes a first HD2 curve 84 that represents the HD2 in the RF output signal 34 of FIG. 2 when the distortion amplifier 48 of FIG. 2 is not employed. The HD2-vs-input-power graph 82 includes a second HD2 curve 86 that represents the HD2 in the RF output signal 34 when the distortion amplifier 48 is employed. The second HD2 curve 86 indicates that the distortion amplifier 48 may help suppress the HD2 in the RF output signal 34 of FIG. 2 by approximately 17 dB when the RF input signal 40 of FIG. 2 is at a power level of approximately 42 dBm. As a result, it may be possible to suppress the HD2 of the LNA circuit 32 to between −106 dBm and −110 dBm, thus helping to achieve the desired performance of the LNA circuit 32.

Figure 4B:
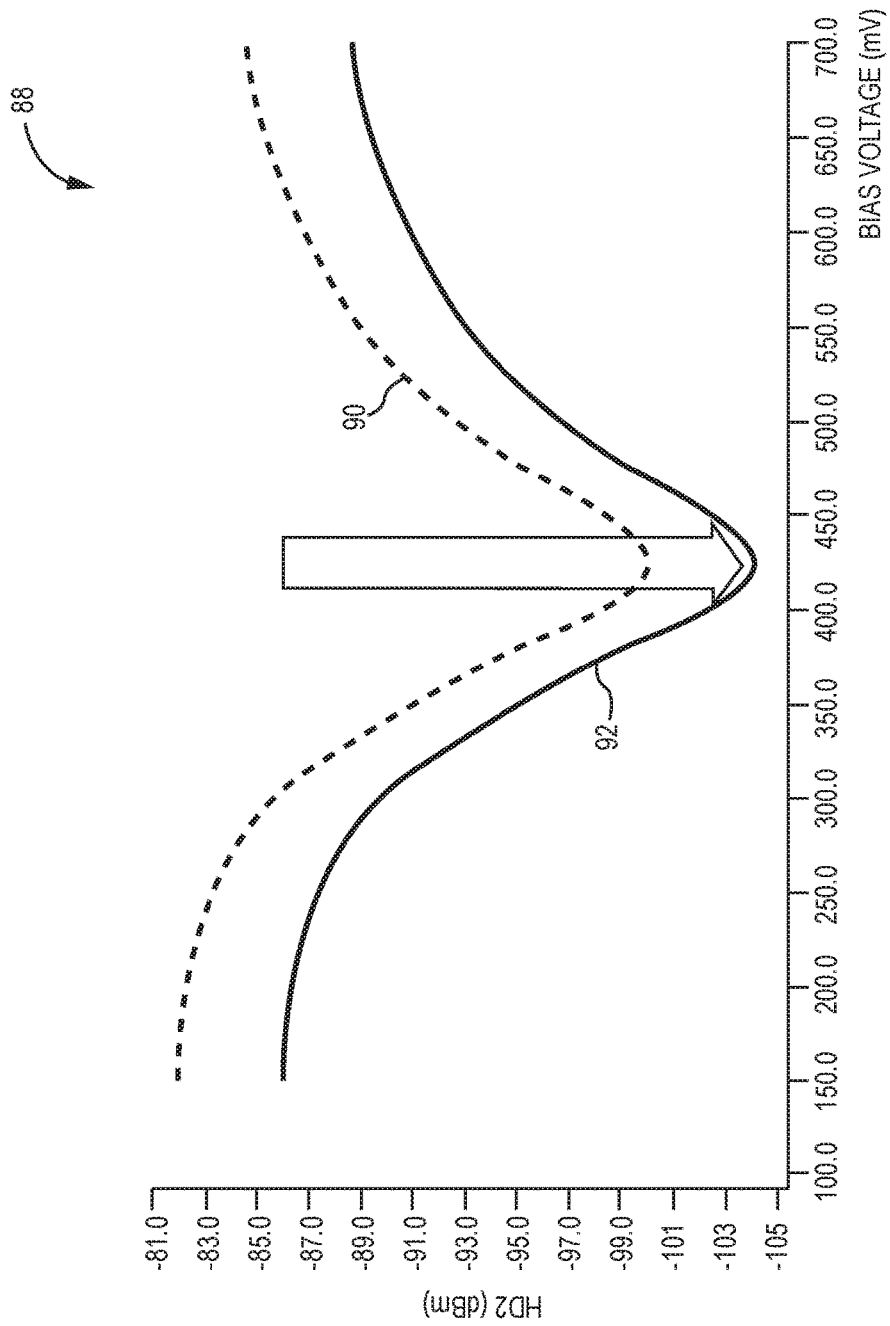
FIG. 4B is an HD2-vs-bias-voltage graph providing an exemplary illustration of HD2 reduction that may be achieved by the LNA circuit of FIG. 2.

FIG. 4B is an HD2-vs-bias-voltage graph 88 providing an exemplary illustration of HD2 reduction that may be achieved by the LNA circuit 32 of FIG. 2. The HD2-vs-bias-voltage graph 88 includes a first HD2 curve 90 that represents the HD2 in the RF output signal 34 of FIG. 2 when the distortion amplifier 48 of FIG. 2 is not employed. The HD2-vs-bias-voltage graph 88 includes a second HD2 curve 92 that represents the HD2 in the RF output signal 34 when the distortion amplifier 48 is employed. The second HD2 curve 92 indicates that the distortion amplifier 48 may help suppress the HD2 in the RF output signal 34 of FIG. 2 by approximately 17 dB when the distortion amplifier 48 is biased at a bias voltage of 425 millivolts (mV).

Figure 4C:
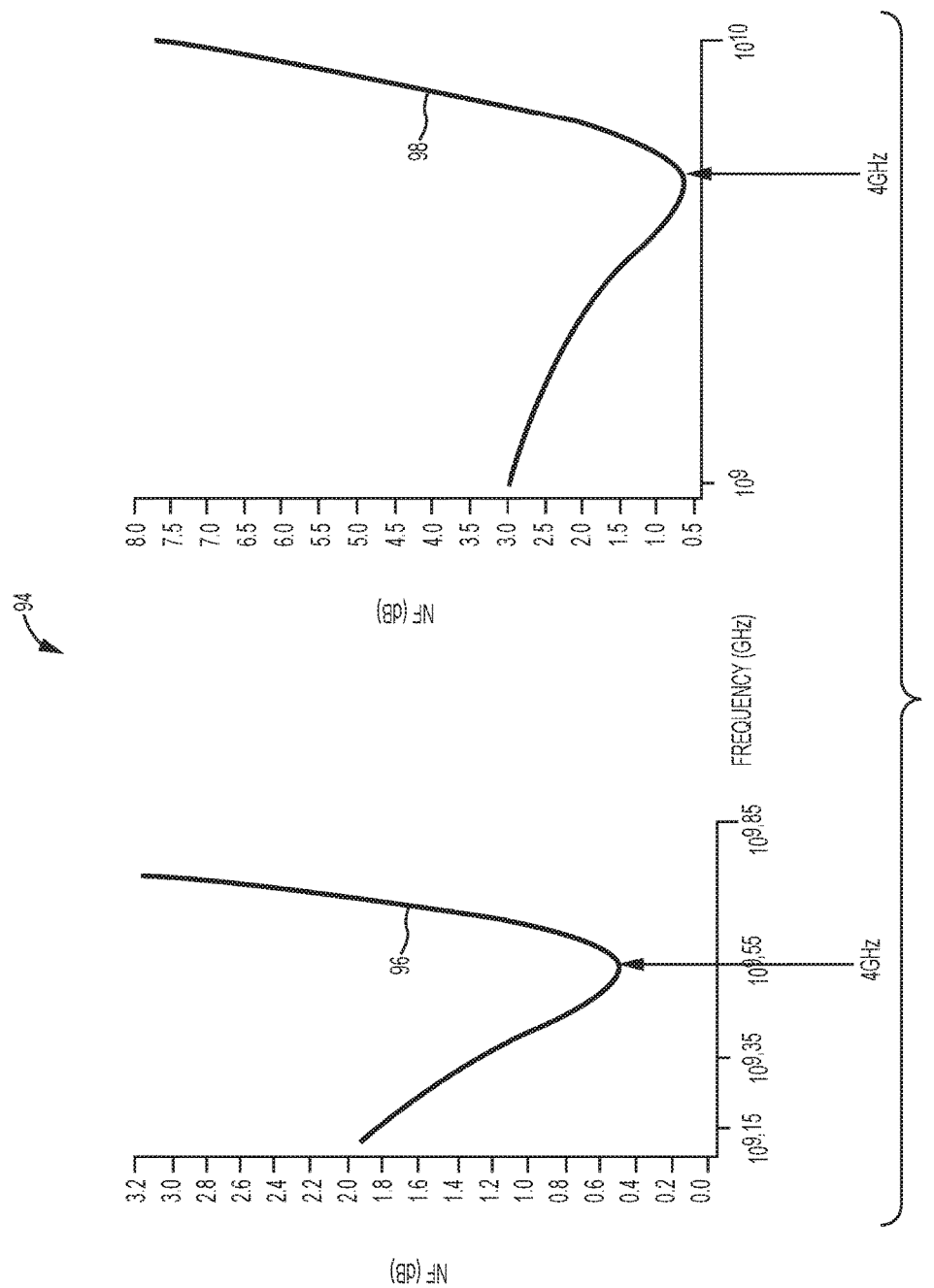
FIG. 4C is a noise figure (NF) graph providing an exemplary illustration of an overall NF of the LNA circuit of FIG. 2.

FIG. 4C is an NF graph 94 providing an exemplary illustration of the distortion amplifier 48 having minimum impact on the overall NF of the LNA circuit 32 of FIG. 2. The NF graph 94 includes a first NF curve 96 that represents the overall NF of the LNA circuit 32 when the distortion amplifier 48 of FIG. 2 is not employed. The NF graph 94 includes a second NF curve 98 that represents the overall NF of the LNA circuit 32 when the distortion amplifier 48 is employed. According to the first NF curve 96, the overall NF of the LNA circuit 32 is approximately 0.7 dB at 4 GHz frequency. According to the second NF curve 98, the overall NF of the LNA circuit 32 is approximately 0.76 dB at the 4 GHz frequency. The NF graph 94 indicates that the distortion amplifier 48 causes the overall NF of the LNA circuit 32 to increase by only 0.06 dB. In this regard, the distortion amplifier 48 has a minimum impact on the overall NF of the LNA circuit 32.

Figure 5A:
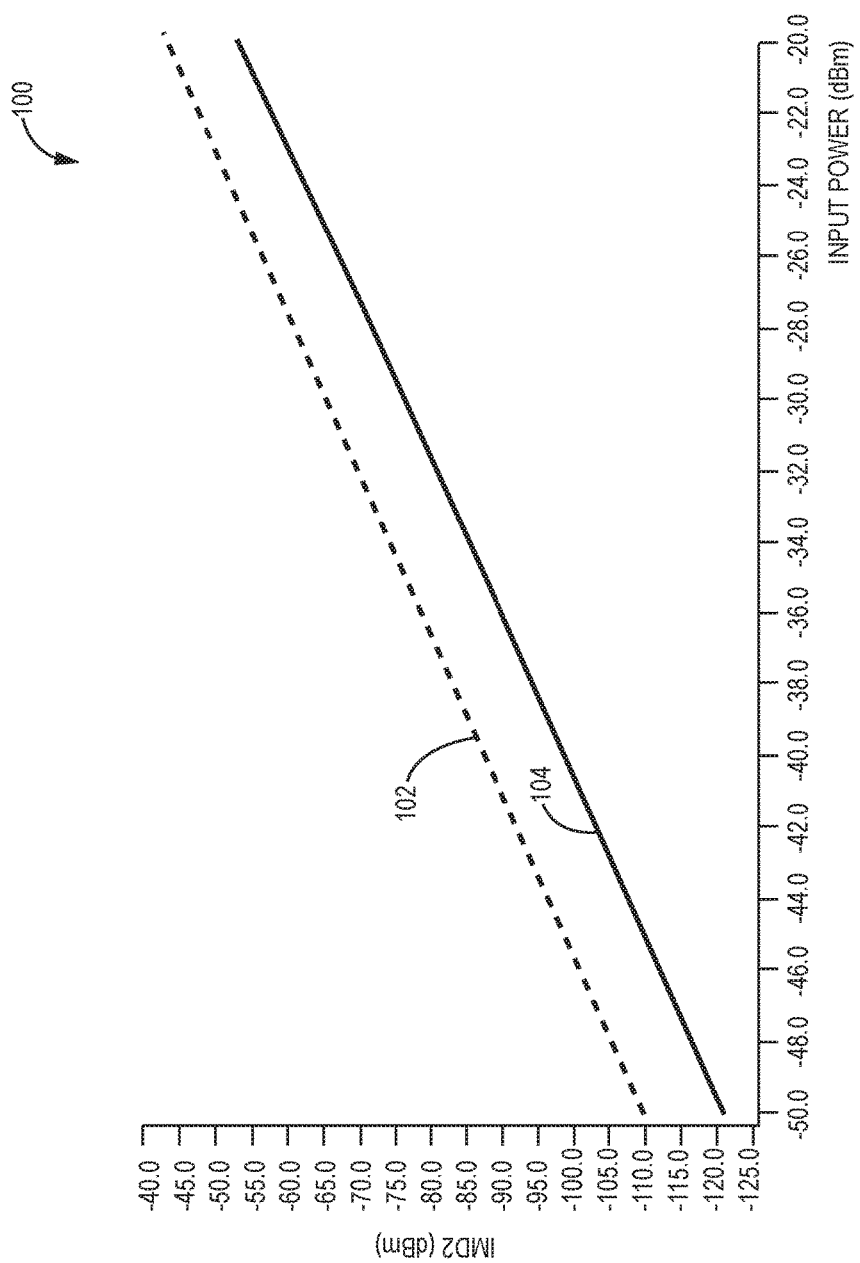
FIG. 5A is an IMD2-vs-input-power graph providing an exemplary illustration of IMD2 reduction that may be achieved by the LNA circuit of FIG. 2.

The distortion amplifier 48 of FIG. 2 may also be configured to suppress the IMD2 associated with the RF output signal 34, as illustrated next with references to FIGS. 5A and 5B. FIG. 5A is an IMD2-vs-input-power graph 100 providing an exemplary illustration of IMD2 reduction that may be achieved by the LNA circuit 32 of FIG. 2. The IMD2-vs-input-power graph 100 includes a first IMD2 curve 102 that represents the IMD2 in the RF output signal 34 of FIG. 2 when the distortion amplifier 48 of FIG. 2 is not employed. The IMD2-vs-input-power graph 100 includes a second IMD2 curve 104 that represents the IMD2 in the RF output signal 34 when the distortion amplifier 48 is employed. The second IMD2 curve 104 indicates that the distortion amplifier 48 may help suppress the IMD2 in the RF output signal 34 of FIG. 2 by approximately 10 dB when the RF input signal 40 of FIG. 2 is at a power level of approximately 42 dBm.

Figure 5B:
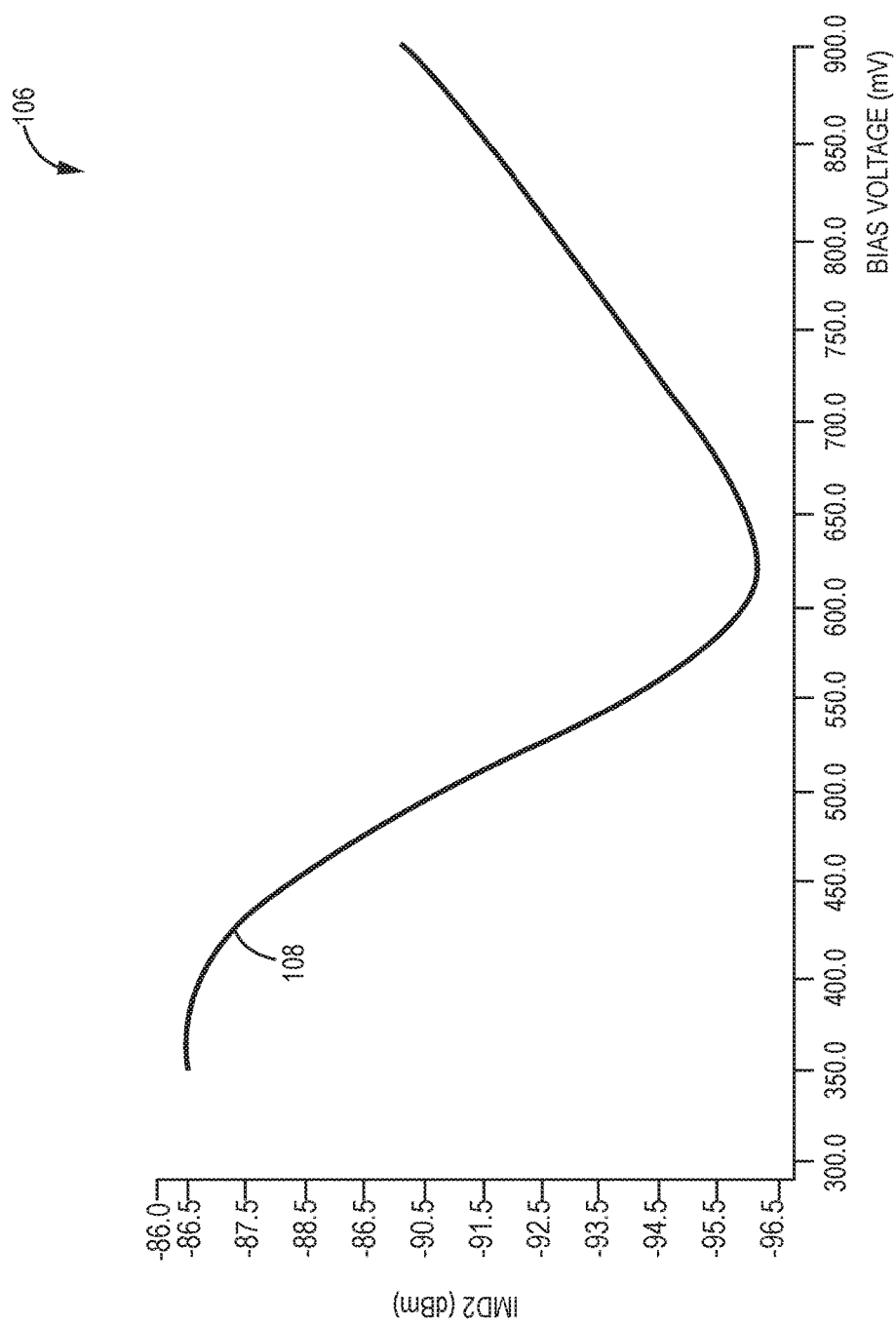
FIG. 5B is an IMD2-vs-bias-voltage graph providing an exemplary illustration of IMD2 reduction that may be achieved by the LNA circuit of FIG. 2.

FIG. 5B is an IMD2-vs-bias-voltage graph 106 providing an exemplary illustration of IMD2 reduction that may be achieved by the LNA circuit 32 of FIG. 2. The IMD2-vs-bias-voltage graph 106 includes an IMD2 curve 108 that represents the IMD2 in the RF output signal 34 of FIG. 2 when the distortion amplifier 48 of FIG. 2 is employed. The IMD2 curve 108 indicates that the distortion amplifier 48 may help suppress the IMD2 in the RF output signal 34 of FIG. 2 by approximately 10 dB when the distortion amplifier 48 is biased at a bias voltage of 625 mV.

As previously illustrated in FIG. 4B, the distortion amplifier 48 can be configured to suppress the HD2 in the RF output signal 34 when the distortion amplifier 48 is biased at the bias voltage of 425 mV. In contrast, as illustrated in FIG. 5B, the distortion amplifier 48 can be configured to suppress the IMD2 in the RF output signal 34 when the distortion amplifier 48 is biased at the bias voltage of 625 mV. In this regard, it may be possible to configure the distortion amplifier 48 to suppress the HD2 and/or the IMD2 by applying different bias voltages to the distortion amplifier 48.

Figure 6:
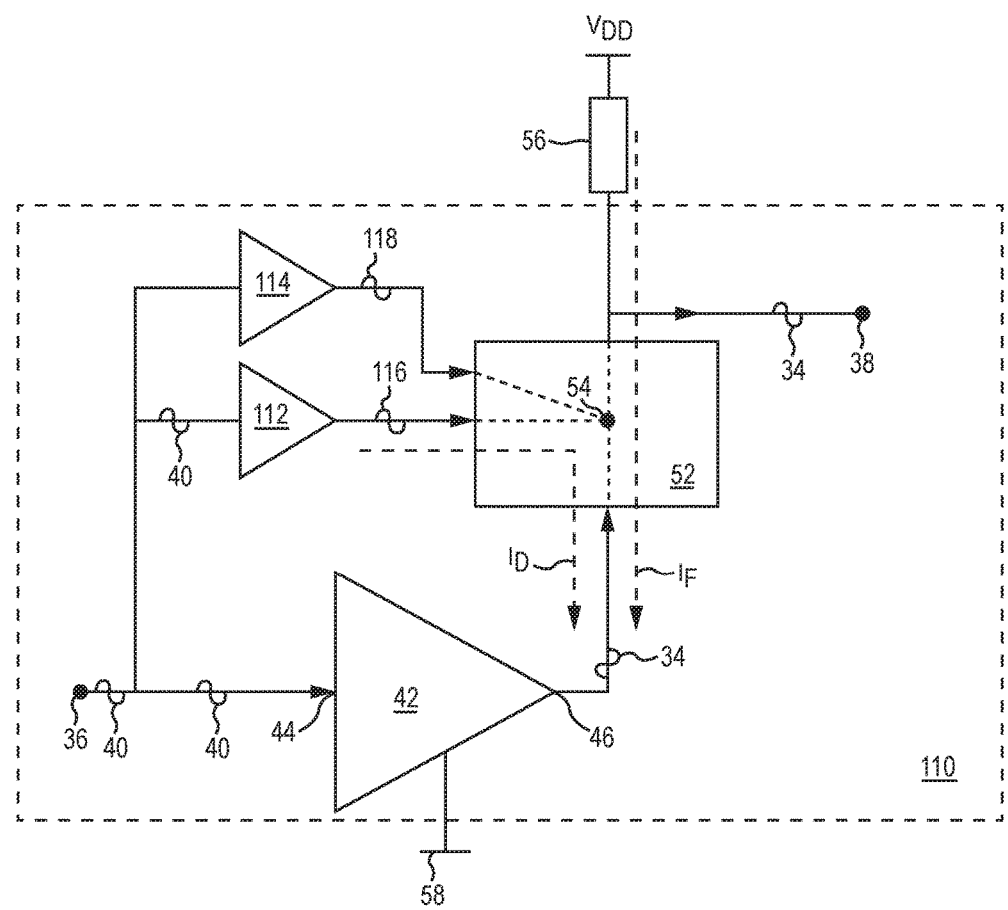
FIG. 6 is a schematic diagram of an exemplary LNA circuit configured to suppress multiple harmonic distortions associated with the RF output signal of FIG. 2.

With reference back to FIG. 2, the distortion amplifier 48 may be configured to suppress HD3 in the RF output signal 34. Furthermore, the LNA circuit 32 of FIG. 2 may be configured to suppress the HD3 concurrently to suppressing the HD2. In this regard, FIG. 6 is a schematic diagram of an exemplary LNA circuit 110 configured to suppress the HD2 and the HD3 associated with the RF output signal 34 of FIG. 2. Common elements between FIGS. 2 and 6 are shown therein with common element numbers and will not be re-described herein.

The LNA circuit 110 includes an HD2 amplifier 112 and an HD3 amplifier 114 provided in parallel to the LNA 42. The HD2 amplifier 112 is configured to generate an HD2 signal 116 with substantially similar amplitude (e.g., <±1%) as the HD2 in the RF output signal 34 and with substantially opposite phase (e.g., 180°±1°) to the HD2 in the RF output signal 34. The HD3 amplifier 114 is configured to generate an HD3 signal 118 with substantially similar amplitude (e.g., <±1%) as the HD3 in the RF output signal 34 and with substantially opposite phase (e.g., 180°±1°) to the HD3 in the RF output signal 34. The combiner circuitry 52 combines the RF output signal 34 generated by the LNA 42, which includes the HD2 and the HD3 for example, with the HD2 signal 116 and the HD3 signal 118. As a result, the HD2 and the HD3 may be suppressed in the RF output signal 34 outputted at the signal output 38. Notably, the LNA circuit 110 may be adapted to suppress additional harmonic distortions, such as fourth harmonic distortion (HD4), fifth harmonic distortion (HD5), and so on, by adding additional harmonic distortion amplifiers.

In addition, it may also be possible to adapt the LNA circuit 110 to suppress the IMD2 and/or the IMD3 in the RF output signal 34 by replacing the HD2 amplifier 112 and the HD3 amplifier 114 with an IMD2 amplifier and an IMD3 amplifier, respectively. Furthermore, it may also be possible to adapt the LNA circuit 110 to suppress additional intermodulation distortions, such as fourth order intermodulation distortion (IMD4), fifth order intermodulation distortion (IMD5), and so on, by adding additional intermodulation distortion amplifiers.

Figure 7:
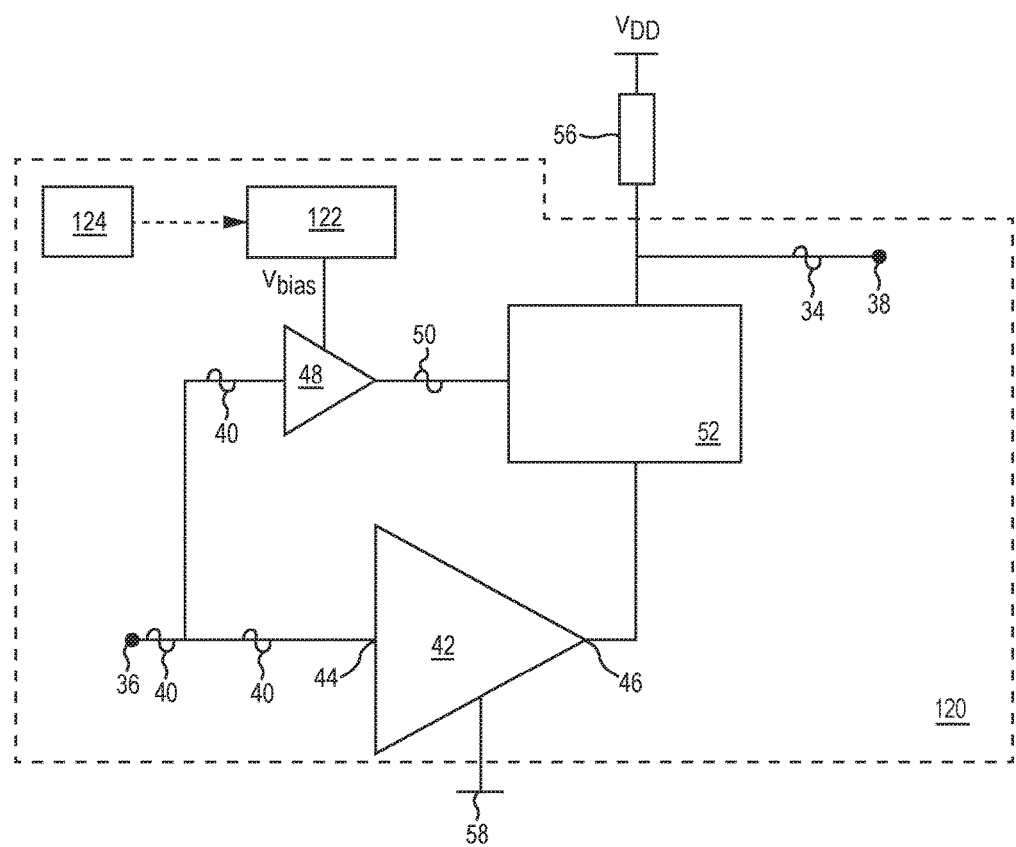
FIG. 7 is a schematic diagram of an exemplary LNA circuit configured to dynamically suppress one or more distortion terms in the RF output signal of FIG. 2.

Alternatively to incorporating additional harmonic amplifiers and/or intermodulation amplifiers, it may also be possible to configure the distortion amplifier 48 in the LNA circuit 32 of FIG. 2 to suppress harmonic distortions and/or intermodulation distortions by dynamically adjusting bias voltage of the distortion amplifier 48. In this regard, FIG. 7 is a schematic diagram of an exemplary LNA circuit 120 configured to dynamically suppress one or more distortion terms in the RF output signal 34 of FIG. 2. Common elements between FIGS. 2 and 7 are shown therein with common element numbers and will not be re-described herein.

The LNA circuit 120 includes bias switching circuitry 122 coupled to the distortion amplifier 48 to provide a bias voltage $V_{bias}$ to the distortion amplifier 48. The LNA circuit 120 also includes control circuitry 124, which can be a microprocessor, a microcontroller, or a field-programmable gate array (FPGA) for example, for controlling the bias switching circuitry 122 to adjust the bias voltage $V_{bias}$ supplied to the distortion amplifier 48.

In one non-limiting example, the control circuitry 124 can control the bias switching circuitry 122 to adjust the bias voltage $V_{bias}$ such that the distortion amplifier 48 generates the distortion signal 50 as an HD2 signal (such as the HD2 signal 116 of FIG. 6) to suppress the HD2 in the RF output signal 34. In another non-limiting example, the control circuitry 124 can control the bias switching circuitry 122 to adjust the bias voltage $V_{bias}$ such that the distortion amplifier 48 generates the distortion signal 50 as an HD3 signal (such as the HD3 signal 118 of FIG. 6) to suppress the HD3 in the RF output signal 34. In another non-limiting example, the control circuitry 124 can control the bias switching circuitry 122 to adjust the bias voltage $V_{bias}$ such that the distortion amplifier 48 generates the distortion signal 50 as the HD2 signal (such as the HD2 signal 116 of FIG. 6) and the HD3 signal (such as the HD3 signal 118 of FIG. 6) to suppress the HD2 and the HD3 in the RF output signal 34.

In another non-limiting example, the control circuitry 124 can control the bias switching circuitry 122 to adjust the bias voltage $V_{bias}$ such that the distortion amplifier 48 generates the distortion signal 50 as an IMD2 signal to suppress the IMD2 in the RF output signal 34. In another non-limiting example, the control circuitry 124 can control the bias switching circuitry 122 to adjust the bias voltage $V_{bias}$ such that the distortion amplifier 48 generates the distortion signal 50 as an IMD3 signal to suppress the IMD3 in the RF output signal 34. In another non-limiting example, the control circuitry 124 can control the bias switching circuitry 122 to adjust the bias voltage $V_{bias}$ such that the distortion amplifier 48 generates the distortion signal 50 as the IMD2 signal and the IMD3 signal to suppress the IMD2 and the IMD3 in the RF output signal 34.

Those skilled in the art will recognize improvements and modifications to the preferred embodiments of the present disclosure. All such improvements and modifications are considered within the scope of the concepts disclosed herein and the claims that follow.

What is claimed is:

1. A low noise amplifier (LNA) circuit comprising:
a signal input configured to receive a radio frequency (RF) input signal in at least one defined RF band;
a signal output configured to output an RF output signal in the at least one defined RF band;
an LNA provided between the signal input and the signal output and configured to amplify the RF input signal to generate the RF output signal, wherein the RF output signal generated by the LNA comprises at least one distortion term comprising at least a third order intermodulation distortion (IMD3) outside the at least one defined RF band;
at least one distortion amplifier comprising at least an IMD3 amplifier provided in parallel to the LNA and configured to generate at least one distortion signal comprising the at least one distortion term; and
combiner circuitry configured to combine the RF output signal and the at least one distortion signal to suppress at least the IMD3 in the at least one distortion term in the RF output signal.

2. The LNA circuit of claim 1 wherein the at least one distortion amplifier is coupled between the signal input and the combiner circuitry and is further configured to block the RF input signal to output exclusively the at least one distortion term in the at least one distortion signal.

3. The LNA circuit of claim 1 wherein the combiner circuitry is provided between the LNA and the signal output and is further configured to:
receive the RF output signal comprising the RF input signal in the at least one defined RF band and the at least one distortion term from the LNA;
receive the at least one distortion signal from the at least one distortion amplifier;
combine the RF output signal received from the LNA and the at least one distortion signal to generate the RF output signal comprising the RF input signal in the at least one defined RF band; and
provide the RF output signal to the signal output.

4. The LNA circuit of claim 3 wherein the at least one distortion term in the at least one distortion signal has substantially similar amplitude as the at least one distortion term in the RF output signal and a substantially opposite phase to the at least one distortion term in the RF output signal.

5. The LNA circuit of claim 3 wherein:
the at least one distortion term further comprises a second harmonic distortion (HD2);
the at least one distortion amplifier further comprises an HD2 amplifier configured to generate an HD2 signal; and
the combiner circuitry is further configured to combine the RF output signal received from the LNA and the HD2 signal to suppress the HD2 in the RF output signal.

6. The LNA circuit of claim 3 wherein:
the at least one distortion term further comprises a third harmonic distortion (HD3);
the at least one distortion amplifier further comprises an HD3 amplifier configured to generate an HD3 signal; and
the combiner circuitry is further configured to combine the RF output signal received from the LNA and the HD3 signal to suppress the HD3 in the RF output signal.

7. The LNA circuit of claim 3 wherein:
the at least one distortion term further comprises a second harmonic distortion (HD2) and a third harmonic distortion (HD3);
the at least one distortion amplifier further comprises an HD2 amplifier and an HD3 amplifier configured to generate an HD2 signal and an HD3 signal, respectively; and
the combiner circuitry is further configured to combine the RF output signal received from the LNA, the HD2 signal, and the HD3 signal to suppress the HD2 and the HD3 in the RF output signal.

8. The LNA circuit of claim 3 wherein:
the at least one distortion term further comprises a second order intermodulation distortion (IMD2);
the at least one distortion amplifier further comprises a second order distortion amplifier configured to generate an IMD2 signal; and
the combiner circuitry is further configured to combine the RF output signal received from the LNA and the IMD2 signal to suppress the IMD2 in the RF output signal.

9. The LNA circuit of claim 3 further comprising:
bias switching circuitry coupled to the at least one distortion amplifier and configured to provide a bias voltage to the at least one distortion amplifier; and
control circuitry coupled to the bias switching circuitry and configured to control the bias switching circuitry to adjust the bias voltage provided to the at least one distortion amplifier.

10. The LNA circuit of claim 9 wherein:
the at least one distortion term further comprises a second harmonic distortion (HD2);

the control circuitry is further configured to control the bias switching circuitry to adjust the bias voltage provided to the at least one distortion amplifier such that the at least one distortion amplifier generates an HD2 signal; and the combiner circuitry is further configured to combine the RF output signal received from the LNA and the HD2 signal to suppress the HD2 in the RF output signal.

11. The LNA circuit of claim 9 wherein:

the at least one distortion term further comprises a third harmonic distortion (HD3);

the control circuitry is further configured to control the bias switching circuitry to adjust the bias voltage provided to the at least one distortion amplifier such that the at least one distortion amplifier generates an HD3 signal; and the combiner circuitry is further configured to combine the RF output signal received from the LNA and the HD3 signal to suppress the HD3 in the RF output signal.

12. The LNA circuit of claim 9 wherein:

the at least one distortion term further comprises a second harmonic distortion (HD2) and a third harmonic distortion (HD3);

the control circuitry is further configured to control the bias switching circuitry to adjust the bias voltage provided to the at least one distortion amplifier such that the at least one distortion amplifier generates an HD2 signal and an HD3 signal concurrently; and the combiner circuitry is further configured to combine the RF output signal received from the LNA, the HD2 signal, and the HD3 signal to suppress the HD2 and the HD3 in the RF output signal.

13. The LNA circuit of claim 9 wherein:

the at least one distortion term further comprises a second order intermodulation distortion (IMD2);

the control circuitry is further configured to control the bias switching circuitry to adjust the bias voltage provided to the at least one distortion amplifier such that the at least one distortion amplifier generates an IMD2 signal; and the combiner circuitry is further configured to combine the RF output signal received from the LNA and the IMD2 signal to suppress the IMD2 in the RF output signal.

14. The LNA circuit of claim 9 wherein:

the control circuitry is further configured to control the bias switching circuitry to adjust the bias voltage provided to the at least one distortion amplifier such that the at least one distortion amplifier generates an IMD3 signal; and the combiner circuitry is further configured to combine the RF output signal received from the LNA and the IMD3 signal to suppress the IMD3 in the RF output signal.

15. The LNA circuit of claim 1 wherein:

the LNA comprises an n-type metal-oxide semiconductor field-effect transistor (nMOSFET) having a first gate electrode, a first source electrode, a first drain electrode, and a first channel region of a first channel length between the first source electrode and the first drain electrode; and the at least one distortion amplifier comprises a p-type metal-oxide semiconductor field-effect transistor (pMOSFET) having a second gate electrode, a second source electrode, a second drain electrode, and a second channel region of a second channel length between the second source electrode and the second drain electrode, wherein the second channel length is at least two times the first channel length.

16. The LNA circuit of claim 15 wherein:

the first drain electrode is coupled to the combiner circuitry;

the first source electrode is coupled to a ground;

the first gate electrode is coupled to the signal input;

the second drain electrode is coupled to the first drain electrode;

the second source electrode is coupled to a bias voltage; and the second gate electrode is coupled to the first gate electrode.

17. The LNA circuit of claim 15 wherein:

the first drain electrode is coupled to the combiner circuitry;

the first source electrode is coupled to a ground;

the first gate electrode is coupled to the signal input;

the second drain electrode is coupled to the first drain electrode;

the second source electrode is coupled to a supply voltage; and the second gate electrode is coupled to the first source electrode.

* * * * *